(12) United States Patent
Kris et al.

(10) Patent No.: US 10,090,850 B2
(45) Date of Patent: Oct. 2, 2018

(54) MICROCONTROLLER WITH DIGITAL DELAY LINE ANALOG-TO-DIGITAL CONVERTER

(71) Applicant: Microchip Technology Incorporated, Chandler, AZ (US)

(72) Inventors: Bryan Kris, Gilbert, AZ (US); Neil Deutscher, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/484,965

(22) Filed: Apr. 11, 2017

(65) Prior Publication Data

US 2017/0294920 A1   Oct. 12, 2017

Related U.S. Application Data

(60) Provisional application No. 62/321,668, filed on Apr. 12, 2016, provisional application No. 62/321,685, (Continued)

(51) Int. Cl.
*H03M 1/12* (2006.01)
*H03M 1/34* (2006.01)
(Continued)

(52) U.S. Cl.
CPC .............. *H03M 1/34* (2013.01); *H03K 5/131* (2013.01); *H03K 5/14* (2013.01); *H03M 1/1009* (2013.01); *H03M 1/1071* (2013.01)

(58) Field of Classification Search
CPC .. H03M 1/1215; H03M 1/1009; H03M 1/502; H03M 1/1038; H03M 1/1052;
(Continued)

(56) References Cited

U.S. PATENT DOCUMENTS

2005/0114426 A1* 5/2005 Lin ..................... H04L 27/01
708/800
2006/0038596 A1* 2/2006 Wang ................. H03L 7/0812
327/158

(Continued)

OTHER PUBLICATIONS

Lee, Minjae et al., "A 9 b, 1.25 ps Resolution Coarse-Fine Time-to-Digital Converter in 90 nm CMOS," IEEE Journal of Solid-State Circuits, vol. 43, No. 4, pp. 769-777, Apr. 1, 2008.

(Continued)

*Primary Examiner* — Linh Nguyen
(74) *Attorney, Agent, or Firm* — Slayden Grubert Beard PLLC

(57) ABSTRACT

Embodiments of the present disclosure include a microcontroller with a processor, memory, and peripheral devices including a differential digital delay line analog-to-digital converter (ADC). The ADC includes differential digital delay lines, a circuit including a set of delay elements included in the differential digital delay lines, and another circuit including another set of delay elements included in the differential digital delay lines. The first circuit is configured to generate data representing an analog to digital conversion of an input. The second circuit is configured to calibrate a source to the differential digital delay lines.

20 Claims, 9 Drawing Sheets

Related U.S. Application Data filed on Apr. 12, 2016, provisional application No. 62/321,687, filed on Apr. 12, 2016, provisional application No. 62/321,694, filed on Apr. 12, 2016.

(51) Int. Cl.
*H03M 1/10* (2006.01)
*H03K 5/131* (2014.01)
*H03K 5/14* (2014.01)

(58) Field of Classification Search
CPC ........ H03M 1/50; H03M 1/52; H03M 1/1014; H03M 1/12; H03M 1/1225; H03M 1/58; H03M 1/68; H03M 3/354; H03M 3/424
USPC .......................................... 341/118–121, 155
See application file for complete search history.

(56) References Cited

U.S. PATENT DOCUMENTS

| | | | | |
|---|---|---|---|---|
| 2006/0055574 | A1* | 3/2006 | Maksimovic | G04F 10/005 341/155 |
| 2007/0268172 | A1* | 11/2007 | Watanabe | H03M 1/502 341/155 |
| 2008/0252507 | A1* | 10/2008 | Gerfers | H03M 1/52 341/155 |
| 2010/0171530 | A1* | 7/2010 | Deppe | G04F 10/10 327/102 |
| 2010/0328130 | A1* | 12/2010 | Bulzacchelli | H03M 1/20 341/166 |
| 2012/0133540 | A1* | 5/2012 | Choi | H03M 1/50 341/166 |
| 2012/0194369 | A1* | 8/2012 | Galton | H03M 3/388 341/120 |
| 2014/0292552 | A1* | 10/2014 | Kim | G04F 10/005 341/156 |
| 2014/0354461 | A1* | 12/2014 | Kawano | H03M 1/502 341/155 |
| 2015/0115925 | A1* | 4/2015 | Teh | H03M 1/068 323/283 |
| 2015/0249461 | A1* | 9/2015 | Terazawa | H03M 1/12 341/155 |

OTHER PUBLICATIONS

Henzler, Stephan et al., "A Local Passive Time Interpolation Concept for Variation-Tolerant High-Resolution Time-to-Digital Conversion," IEEE Journal of Solid-State Circuits, vol. 43, No. 7, pp. 1666-1676, Jul. 1, 2008.

Naraghi, Shahrzad, "Time-Based Analog to Digital Converters," Dissertation, University of Michigan, URL: http://deepblue.lib.umich.edu/bitstream/handle/2027.42/64787/nara?sequence=1, 118 pages, Jan. 1, 2009.

Li, Guansheng et al., "Delay-Line-Based Analog-to-Digital Converters," IEEE Transactions on Circuits and Systems—II: Express Briefs, vol. 56, No. 6, pp. 464-468, Jun. 1, 2009.

Tousi, Yahya et al., "A Miniature 2 mW 4 bit 1.2 Gs/s Delay-Line-Based ADC in 65 nm CMOS," IEEE Journal of Solid-State Circuits, vol. 46, No. 10, pp. 2312-2325, Oct. 1, 2011.

Huang, Po-Tsang et al., "2.5D Heterogeneously Integrated Microsystem for High-Density Neural Sensing Applications," IEEE Transactions on Biomedical Circuits and Systems, vol. 8, No. 6, pp. 810-823, Dec. 1, 2014.

International Search Report and Written Opinion, Application No. PCT/US2017/027243, 20 pages, Jul. 20, 2017.

* cited by examiner

Adc_avss - ANALOG Vss
Adc_avdd - ANALOG Vdd
Vinp_ana[] - POSITIVE ANALOG VOLTAGE INPUT
Vinn_ana[] - NEGATIVE ANALOG VOLTAGE INPUT
Range_mv[] - WHEN ASSERTED, DOUBLE THE RANGE OF INPUT VOLTAGE: 0: INPUT RANGE +/- 0.2V; 1: INPUT RANGE +/- 0.4V
V2Itrim_mv - TRIM VOLTAGE ACCORDING TO OUTSIDE LEVELS
Isrc_ana[]- BIAS CURRENT ADJUSTMENTS
Pbias_ana - pbias OUTPUT
Nbias_ana - nbias OUTPUT

MICROCONTROLLER WITH DIGITAL DELAY LINE ANALOG-TO-DIGITAL CONVERTER

PRIORITY

The present application claims priority to U.S. Provisional Applications 62/321,668; 62/321,685; 62/321,687; and 62/321,694, each filed Apr. 12, 2016, and which are hereby incorporated in their entirety.

TECHNICAL FIELD

The present disclosure relates to time-based delay line analog to digital converters (ADC), in particular such microcontrollers with such converters with background calibration, range adjustment and out of range estimation.

BACKGROUND

Many different kinds of ADCs exist and their use often depends on the application. ADCs may vary according to a bit size, wherein the analog signal will be digitized into $2^i$ different digital values, wherein the ADC is an n-bit converter, using n-bits to represent the range of analog values. Moreover, ADCs may include an input range for the analog signal. The lowest digitized output of the ADC (e.g., 00000000 for an 8-bit ADC) may correspond to the lower limit of analog signal input. The highest digitized output of the ADC (e.g., 11111111 for an 8-bit ADC) may correspond to the upper limit of analog signal input. Such example values may specify positive or unsigned values, though two's complement binary enumeration may be used instead. An ADC may have a defined bandwidth that may correspond to a sampling rate, or how often the analog signal is sampled. The ADC may output values according to varying degrees of linearity.

SUMMARY

Figure 1:
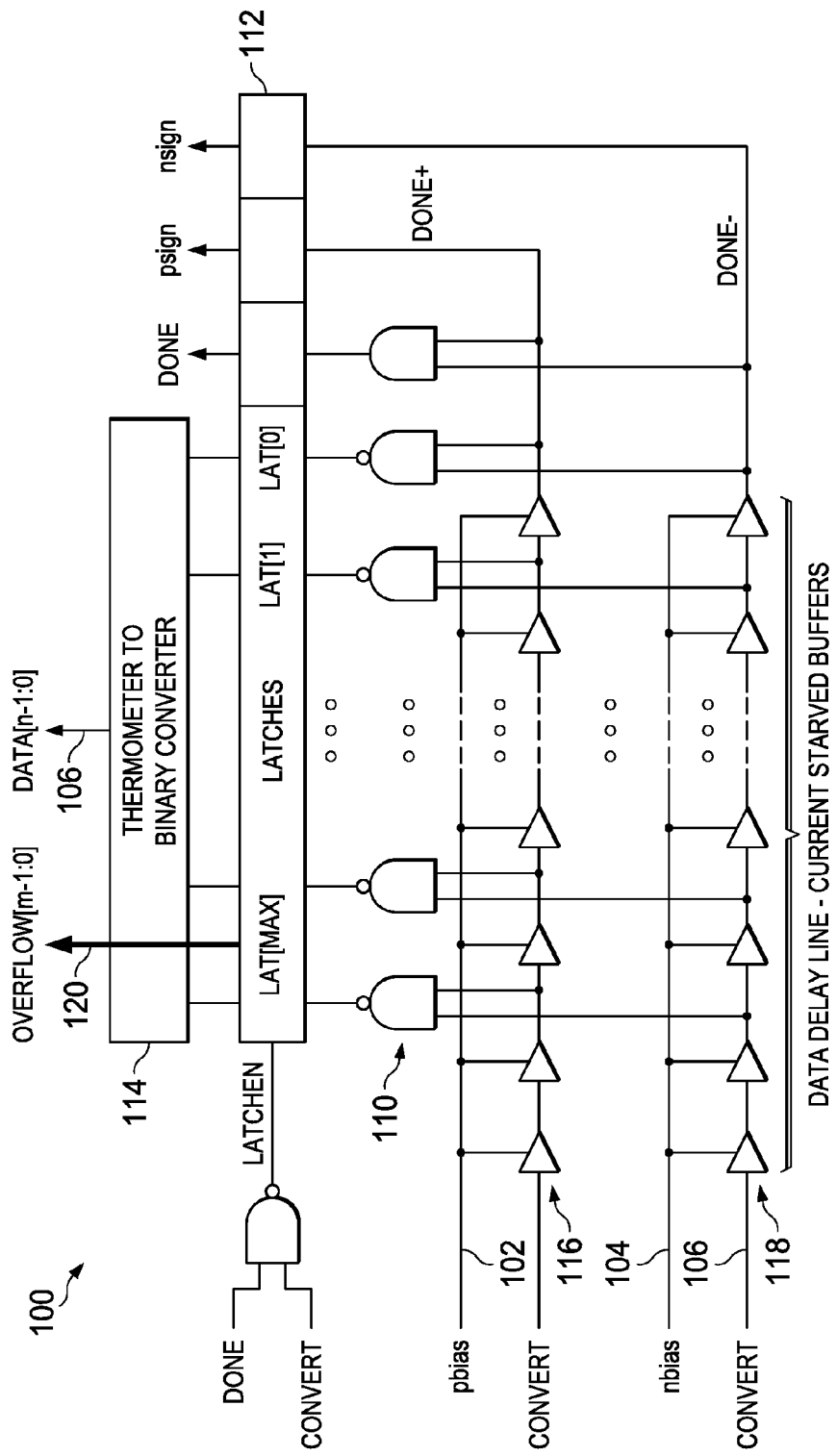
FIG. 1 illustrates an example over range protection variable resolution differential delay line ADC, according to embodiments of the present disclosure.

Embodiments of the present disclosure include a differential digital delay line ADC, including differential digital delay lines, a first circuit comprising a set of delay elements included in the differential digital delay lines, and a second circuit comprising another set of delay elements included in the differential digital delay lines. In combination with any of the above embodiments, the first circuit is configured to generate data representing an analog to digital conversion of an input. In combination with any of the above embodiments, the second circuit is configured to calibrate a source to the differential digital delay lines. In combination with any of the above embodiments, the first circuit is configured to measure a difference between an input voltage and a reference voltage. In combination with any of the above embodiments, the ADC includes a current source circuit configured to mirror reference currents to each of the differential digital delay lines. In combination with any of the above embodiments, the current source circuit is configured to mirror reference currents to each of the differential digital delay lines, wherein the second circuit is configured to adjust the reference currents to minimize error. In combination with any of the above embodiments, the ADC includes a transconductor configured to convert an input differential voltage to a differential current, wherein the first circuit is configured to measure the differential current and generate data representing the differential voltage. In combination with any of the above embodiments, the ADC includes a transconductor configured to convert an input differential voltage to a differential current, and accept an input based on the plurality of differential digital delay lines to adjust a voltage-to-current range. In combination with any of the above embodiments, each differential digital delay line includes a chain of current limited buffers. In combination with any of the above embodiments, a given differential digital delay line is configured to operate at a speed according to a differential current applied to the given differential digital delay line. In combination with any of the above embodiments, the ADC further includes a latch configured to save data from a slower differential digital delay line upon a completion of faster differential digital delay line. In combination with any of the above embodiments, the ADC includes a third circuit comprising yet another set of delay elements included in the differential digital delay line, wherein the third circuit is configured to produce data to indicate a degree to which an input to the ADC is out of an input range.

Embodiments of the present disclosure include a differential digital delay line ADC, including differential digital delay lines, a first circuit comprising a set of delay elements included in the differential digital delay lines, and a second circuit comprising another set of delay elements included in the differential digital delay lines. In combination with any of the above embodiments, the first circuit is configured to generate data representing an analog to digital conversion of an input. In combination with any of the above embodiments, the second circuit is configured to produce data to indicate a degree to which an input to the ADC is out of an input range. In combination with any of the above embodiments, the first circuit is configured to measure a difference between an input voltage and a reference voltage. In combination with any of the above embodiments, the ADC includes a current source circuit configured to mirror reference currents to each of the differential digital delay lines. In combination with any of the above embodiments, the ADC includes a current source circuit configured to mirror reference currents to each of the differential digital delay lines, wherein the second circuit is configured to adjust the reference currents to minimize error. In combination with any of the above embodiments, the ADC includes a transconductor configured to convert an input differential voltage to a differential current, wherein the first circuit is configured to measure the differential current and generate data representing the differential voltage. In combination with any of the above embodiments, the transconductor is configured to accept an input based on the plurality of differential digital delay lines to adjust a voltage-to-current range. In combination with any of the above embodiments, each differential digital delay line includes a chain of current limited buffers. In combination with any of the above embodiments, a given differential digital delay line is configured to operate at a speed according to a differential current applied to the given differential digital delay line. In combination with any of the above embodiments, the ADC further comprises a latch configured to save data from a slower differential digital delay line upon a completion of faster differential digital delay line. In combination with any of the above embodiments, the ADC further includes a third circuit comprising a yet another set of delay elements included in the differential digital delay line, wherein the third circuit is configured to calibrate a source to the differential digital delay lines.

Embodiments of the present disclosure include processors, microcontrollers, electronic devices, die packages, semiconductor packages, and semiconductor devices including any of the ADCs of the above embodiments. Embodiments of the present disclosure include a microcontroller with a processor core, memory, and peripheral devices including any of the ADCs of the above embodiments.

Embodiments of the present disclosure include methods performed by any of the ADCs, processors, microcontrollers, electronic devices, die packages, semiconductor packages, and semiconductor devices of the above embodiments.

DETAILED DESCRIPTION

FIG. 1 illustrates an example over range protection variable resolution differential delay line ADC 100, according to embodiments of the present disclosure.

ADC 100 may be used in, for example, switched-mode power systems (SMPS). An SMPS control loop may utilize measurements of analog values. The control loop may require fast, one-execution-cycle measurements. Reading and acting on values measured by ADC 100 in a single cycle may improve stability and efficiency of the SMPS. Accordingly, a very fast implementation of ADC 100 may be needed. Speed of ADC 100 may affect resolution of ADC 100 in order to update, during run-time, pulse-width-modulation (PWM) commands during a PWM cycle.

ADC 100 may be implemented as a digital delay line (DDL) ADC. Through implementation as a digital delay line ADC, ADC 100 may perform its measurements at a lower cost and less power than conventional flash ADCs. In one embodiment, ADC 100 may include background calibration. In another embodiment, ADC 100 may include range adjustment. In yet another embodiment, ADC 100 may estimate how far out of a desired range that its analog input would be measured. Incorporating background calibration or range adjustment improves performance and functionality. When the error voltage of ADC 100 goes out of range, it can be difficult for control loops using ADC 100 to re-acquire a lock. The out of range estimate created by ADC 100 provides the direction, and a qualitative estimate of the error, so that an algorithm can make necessary adjustment. Even if the estimate is outside the accurate range of the ADC, a qualitative estimate of just how far outside the accurate range the estimate is may allow better action and performance.

ADC 100 may be implemented largely with digital, low voltage logic. Accordingly, ADC 100 may be small with respect to footprint or die size. Furthermore, ADC 100 may thus require low power. Also, ADC 100 may thus operate very fast. Accordingly, ADC 100 may be used as an error-calculating ADC in an SMPS control loop.

Background calibration may improve ADC 100 performance with regards to key metrics such as resolution and accuracy. Range adjustment may make SMPS control loops more flexible and adaptable to system needs for whatever system ADC 100 is implemented. Out of range estimation may provide useful information when ADC 100 is out of its linear range (with respect to its input). Furthermore, ADC 100 may specify as part of the estimation a qualitative or quantitative magnitude and sign or direction of the out-of-range input.

Figure 2:
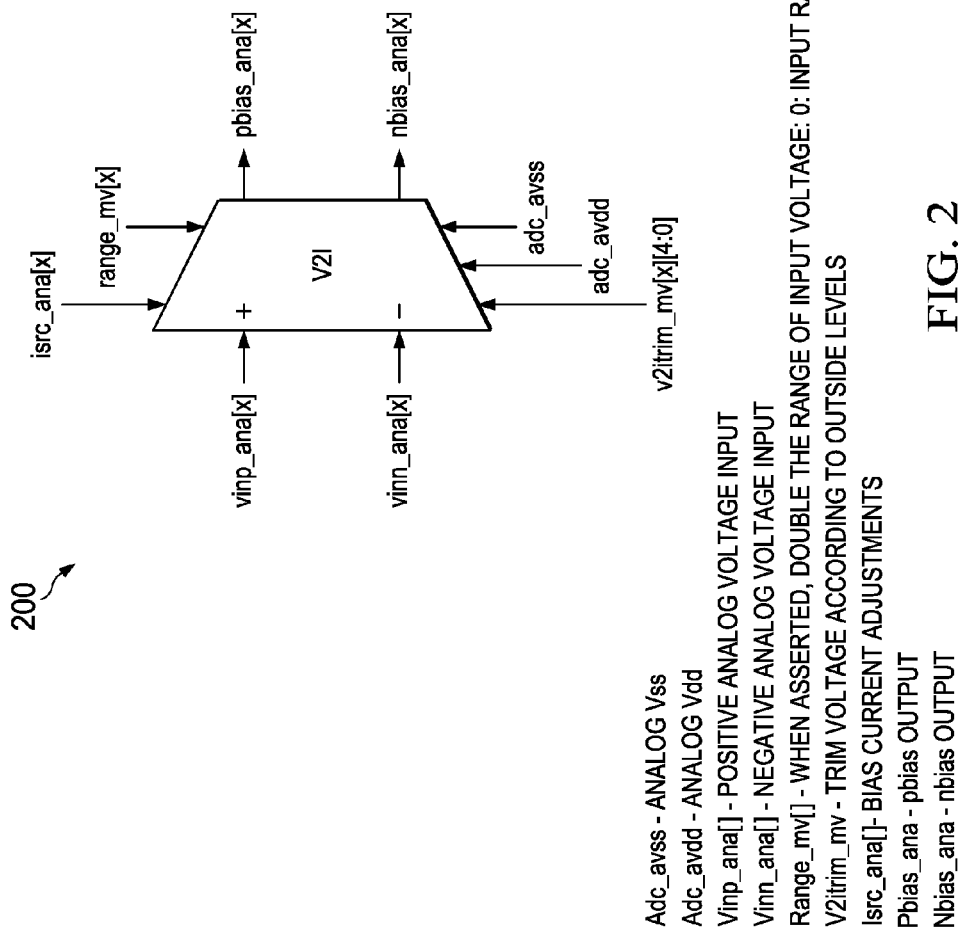
FIG. 2 illustrates a representation of an input circuit, according to embodiments of the present disclosure.

By implementing ADC 100 as a delay line ADC, ADC 100 may convert a differential voltage into differential currents. FIG. 2 illustrates a representation of an input circuit 200, according to embodiments of the present disclosure. Input circuit 200 may interface with ADC 100 or may be implemented as part of ADC 100. Input circuit 200 may be configured to convert the differential voltage between an input voltage and a reference voltage into a current. In particular, input circuit 200 may convert the differential voltage into a pbias and an nbias current. Input circuit 200 may be implemented by a set of transistors. The difference between the differential currents is related to the differential between the input voltage and the reference voltage. One of the pbias or nbias current will be stronger than the other. Moreover, one of the pbias or nbias currents will be stronger than the other to a degree that the input voltage or the reference voltage was higher.

Returning to FIG. 1, the outputs of pbias current and nbias current may be applied as inputs 102, 104. ADC 100 may function with a data delay line through current starved buffers 116, 118. Each element of buffers 116, 118 may activate to propagate its input when current from respective nbias 102, pbias 104 current reaches the element. The buffer state might initially be all zeroes, and the convert signal 106 that is to be propagated may be a one. In other cases, the buffer state might initially be all ones, and the convert signal 106 that is to be propagated may be a zero. As each element of buffers 116, 118 is to activate to propagate its input when current from respective nbias 102, pbias 104 current reaches the element, the buffer associated with the larger, and thus faster, current of nbias 102 or pbias 104 currents may fill up first. The buffer may fill up with the propagated value from convert signal 106. The other buffer might not fill all the way up, but may fill up according to the relative speed (and thus size) of its current. Accordingly, ADC 100 may examine, upon completion of one of buffers 116, 118, the status of the incomplete buffer of buffers 116, 118. Based upon the number of filled elements within the partially filled buffer, the relative difference between nbias 104 and pbias 102 may be ascertained. Based upon this relative difference, the difference between the input voltage and the reference voltage may be ascertained. Buffers 116, 118 may be referred to as current starved buffer in that the buffer is waiting to activate until current is received from pbias 102 or nbias 104. Buffers 116, 118 will activate successively with a speed related to the size of the respective differential currents.

ADC 100 may be configured to represent the difference in speeds between pbias 102 and nbias 104 through the relative speeds of each buffer 116, 118 through a thermometer code. The code may be stored in latches 112. Latches 112 may store the thermometer code as a snapshot of buffers 116, 118 upon completion of the first of pbias 102 and nbias 104. Upon completion of the first of pbias 102 or nbias 102, the respective buffer of buffers 116, 118 may output its signal that, instead of propagating to the next delay element, may become done+ or done−, respectively. Done+ may represent that buffer 116 has finished propagating (due to pbias 102), and done− may represent that buffer 118 has finished propagating (due to nbias 104). An OR gate may combine done+ and done− to generate a done signal. The done signal may be fed as a control to set the values of latches 112. Thus, latches 112 may accept its values when the done signal is generated, which would be upon the completion of the first of buffers 116, 118. The one of done+ and done− that is set or completed may be saved as a sign, indicating the sign of the differential. The sign may be represented by whichever of psign and nsign is set. Latches 112 may also be set or reset according to whether the convert signal has been issued.

At the time at which the values of latches 112 are to be set (because nbias 102 or pbias 104 has finished passing through its respective buffer), the present values of buffers 116, 118 may be loaded into latches 112. In one embodiment, a modified version of the values may be loaded into latches 112. For example, the values from corresponding elements of buffers 116, 118 may be passed together through a NAND gate before the result is stored in a corresponding element of latches 112. As a result, latches 112 may store a string of ones followed by a string of zeroes, and the location at which the ones switch to zeroes may represent the location at which the slower of pbias 102 or nbias 104 reached in its respective buffer when the faster of pbias 102 or nbias 104 reached the end of its respective buffer and generated a done signal. The thermometer code showing this location of the slower of pbias 102 or nbias 104 may be converted by a shift register, multiplier, or other algorithmic circuit in thermometer to binary converter 114. The resulting data 106 may be used to show the relative difference between pbias 102 and nbias 104. The difference in the voltage that generated pbias 102 and nbias 104 may then be inferred from the resulting data 106. In some embodiments, such as in voltage regulators, this difference may be the difference between actual output voltage of the regulator and the desired level of output voltage of the regulator.

ADC 100 includes buffers 116, 118 implemented with digital cells. Accordingly, ADC 100 may have a small footprint or die requirement as well as low power. ADC 100 may thus be faster than other ADCs, which may include latency of ~200 ns for ADC core operation, ~100 ns for ADC control, and ~80 ns for interrupt latency, for a total of ~380 ns. In contrast, using DDL buffers, ADC 100 may be fast and small. For example, ADC 100 may be as small as 55 nm. The operation of ADC 100, implemented as a 4-bit plus sign DDL ADC, may be 4.1 ns. A 5-bit plus sign DDL ADC implementation may operate at 8.2 ns and occupy 36 sq. mils (for a group of 4). A 6-bit plus sign DDL ADC may operate at 16.4 ns and occupy 44 sq. mils (group of 4). A 7-bit plus sign DDL ADC may operate at 32.8 ns, and may occupy 60 sq. mils (group of 4). In contrast, an ADC implemented as a conventional flash ADC might be fast, but in current submicron technology nodes may be large and consume significant current. A delay line ADC such as ADC 100 may be comparatively much smaller and lower power.

Figure 3:
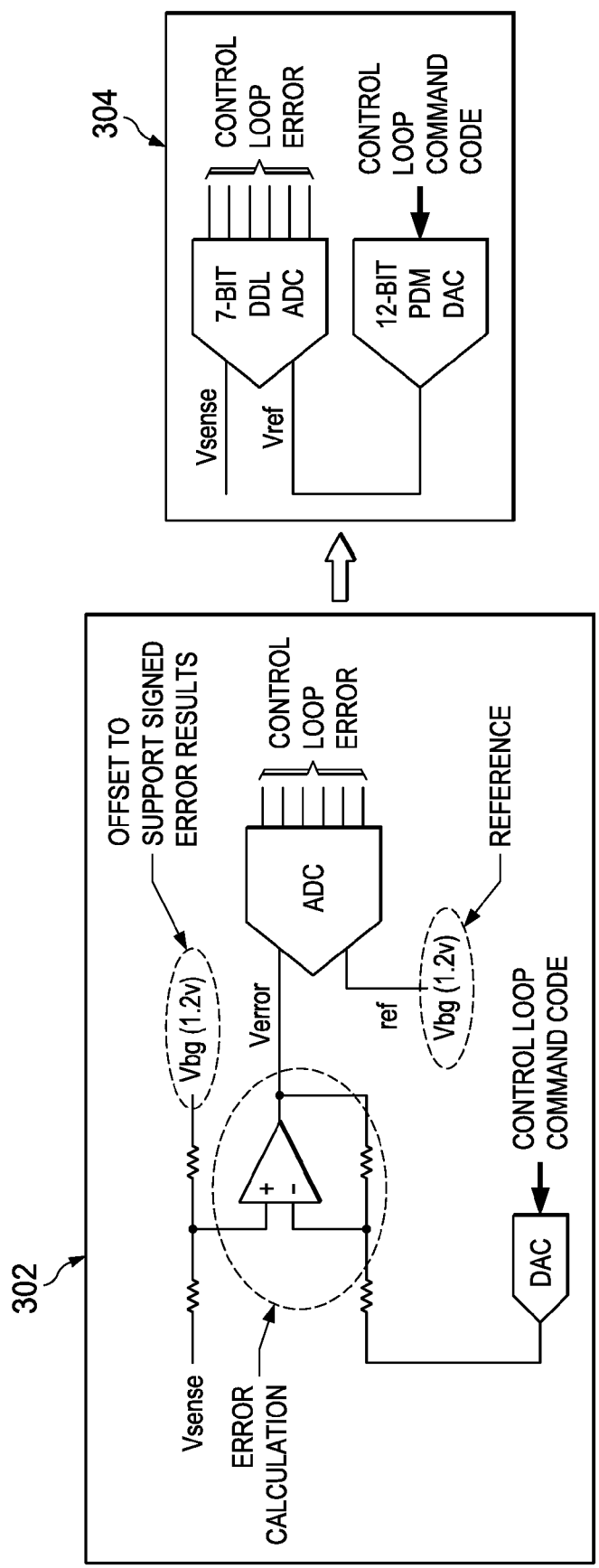
FIG. 3 illustrates a typical usage model of an ADC, according to embodiments of the present disclosure.

FIG. 3 illustrates a typical usage model of ADC 100, according to embodiments of the present disclosure. In particular, 302 illustrates use of an ADC in a voltage regulator feedback determination, wherein the ADC fails to implement the teachings of the present disclosure. 304 illustrates use of ADC 100 in a voltage regulator feedback, according to the teachings of the present disclosure.

In 302, a voltage sense (Vsense) may sense voltage as-outputted by a voltage regulator. This voltage is to be compared against a reference voltage. The reference voltage may be specified by a control loop command code applied to a digital-to-analog-converter, which may produce an analog signal of the desired voltage reference level. The Vsense and the reference voltage may be input into a comparator. The comparator may also be connected to another voltage reference (Vbg) to support or accommodate signed error results. Vbg may also be referenced by the ADC itself. An error may be output from the ADC, representing the control loop error between the reference voltage and Vsense.

In 304, the voltage sense and the reference voltage may be applied to ADC 100. Additional elements, such as Vbg, may be unnecessary. Furthermore, the comparator used in 302 may be unnecessary.

Returning to FIG. 1, in one embodiment, ADC 100 may include delay elements to perform out-of-range estimation. Each of buffers 116, 118 may include p delay elements. The p delay elements may be sufficient for ADC 100 to implement a ADC conversion with a resolution of q bits. The conversion of voltage differential to a binary data 106 may be performed with n delay elements. The thermometer code may be n bits wide. However, there may be additional delay elements included in each of buffers 116, 118 before such n delay elements that are actually used for voltage differential calculation. There may be any suitable number of such delay elements, such as 1 up to m such delay elements. The output of these additional delay elements may be output as overflow 120. These extra delay elements and resulting bits at the beginning of respective buffers 116, 118 may be included in ADC 100 so that the transconductor of the voltage-to-current converter of FIG. 2 and that then delay cells of ADC 100 may operate within linear regions. Without inclusion of the m delay cells, the speed of the current through the n delay cells might not be precisely proportional to the current differential generated by the voltage-to-current converter.

In one embodiment, ADC 100 may capture the output of them delay cells as overflow 120. Overflow 120 may be used to generate an estimate of the voltage value of the vsense when it is out of range with respect to the current settings. The estimate may be used by part of the system in which ADC 100 is implemented to take corrective action. The corrective action may include changing an input range for ADC 100, changing the reference voltage, or other suitable action.

For example, the input range of ADC 100 may be 200 millivolts. If the reference voltage is 1.0 V, and the sensed voltage is 1.4 V, ADC 100 may produce a thermometer code corresponding to a voltage difference of 0.2 V. However, the maximum differential that can be represented given the resolution of ADC 100 is 0.2 V. Accordingly, ADC 100 may report that the differential between the sensed voltage and the reference voltage is 0.2 V. However, a consumer of such information may recognize that the differential value is the maximum value reportable by ADC 100, and thus it is likely that the actual differential is greater than the reported value.

ADC 100 may provide overflow 120. A consumer of the output of ADC 100 may utilize overflow 120 when the output of ADC 100 indicates a maximum voltage differential of inputs of ADC 100. In one embodiment, overflow 120 may be reused from existing delays of an ADC 100 from portions of buffers 116, 118 that are not used to represent voltage differential from the range of input values of ADC 100. As discussed above, overflow 120 may be reused from delays that are used to linearize thermometer code with the current differential.

In one embodiment, when data 106 is a maximum or minimum value (wherein the maximum versus minimum nature is specified by the sign of data 106) overflow 120 may be evaluated qualitatively. Such an evaluation may be because of the non-linear range of the transconductor or delay cell.

In one embodiment, ADC 100 may be configured to perform range adjustment. Input ranges for ADC 100 may be designed, for example, to have a +/−200 mV or +/−400 mV range. The range may be selectable. In a further embodiment, ADC 100 may select one of the available ranges (such as +/−200 mV or +/−400 mV) based upon prior outputs of data 106. For example, if data 106 indicates a maximum differential and the input range is selected as +/−200 mV, then the input range may be changed to +/−400 mV. In another example, if data 106 indicates that the voltage differential is less than half of the available input range and the input range is +/−400 mV, then the input range may be changed to +/−200 mV. The narrower range might be used to increase effective resolution while a same number of bits are used. The wider range might be used initially to find an initial error voltage and then as SMPS control loops bring measured and reference voltages to a closer level, the range may be decreased.

In one embodiment, ADC 100 may be configured to perform calibration. For example, calibration might be performed by adjusting the current to individual ones of pbias 102 or nbias 104. In another example, calibration might be performed by adjusting the current to both of pbias 102 and nbias 104. Adjusting the current may adjust the speed or offset of pbias 102 or nbias 104. The current may be adjusted according to a calibration line in the overflow. For example, if the overflow indicates that the differential is great, the current in a current source circuit may be adjusted up or down according to a sign of the differential.

In another embodiment, ADC 100 may be configured to perform calibration by adjusting the length of delay lines 116, 118. The length of delay lines 116, 118 may be effectively adjusted by adding enable elements such as multiplexers to selectively eliminate usage of some of the delays in delay lines 116, 118.

Figure 4:
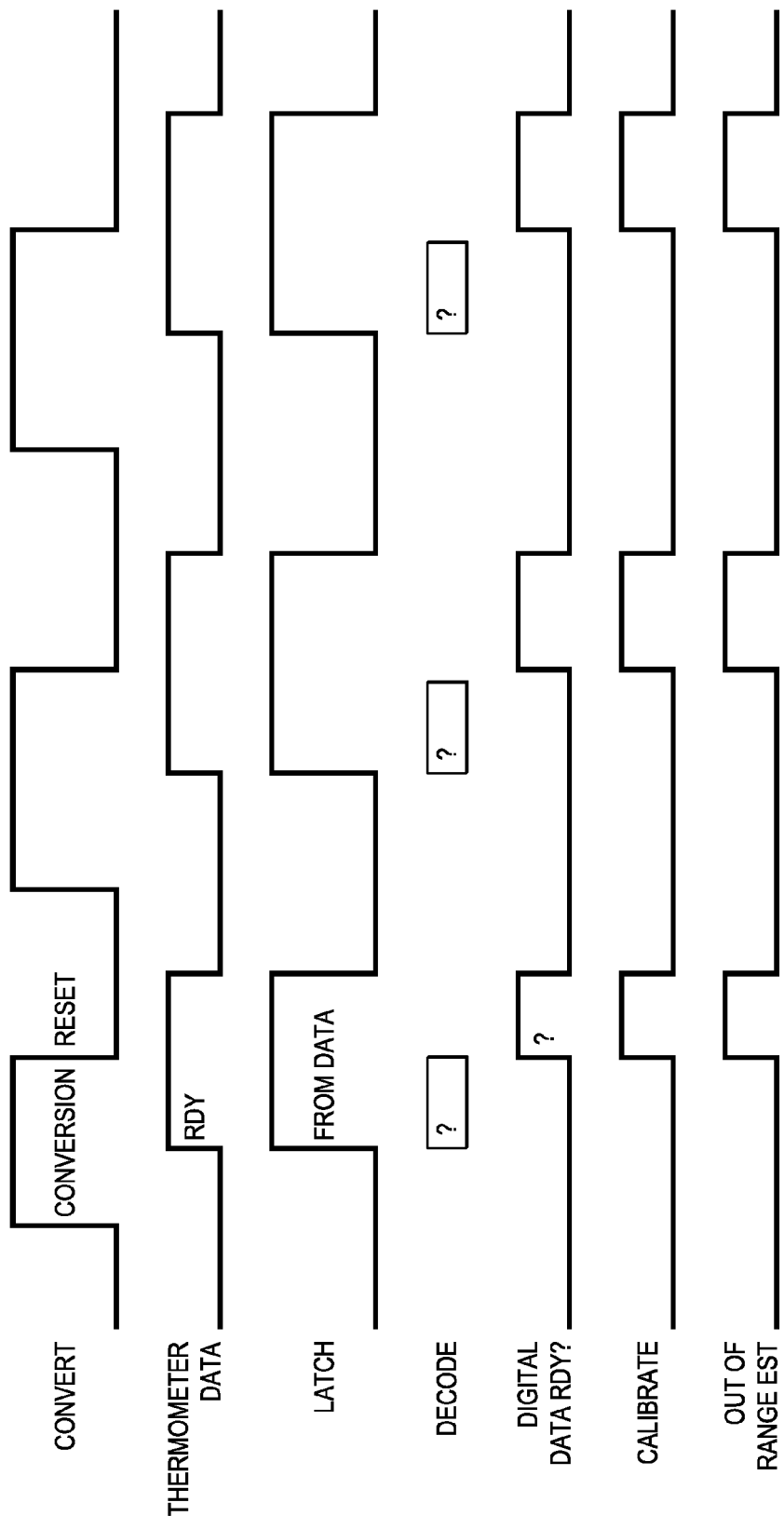
FIG. 4 illustrates a timing diagram of operation of ADC, according to embodiments of the present disclosure.

FIG. 4 illustrates a timing diagram of operation of ADC 100, according to embodiments of the present disclosure. As show, a convert signal may start an analog to digital conversion. Clearing the convert signal may act as a reset. Upon finishing of one of the first of the nbias or pbias signal, the associated delay line will finish. Accordingly, the latch signal will be triggered and the associated thermometer code will be latched. The thermometer code may be decoded to a digital value during a time of suitable length. When the convert signal goes low again, the delay lines may be reset. If necessary, calibration and out-of-range estimations may be applied.

Figure 5:
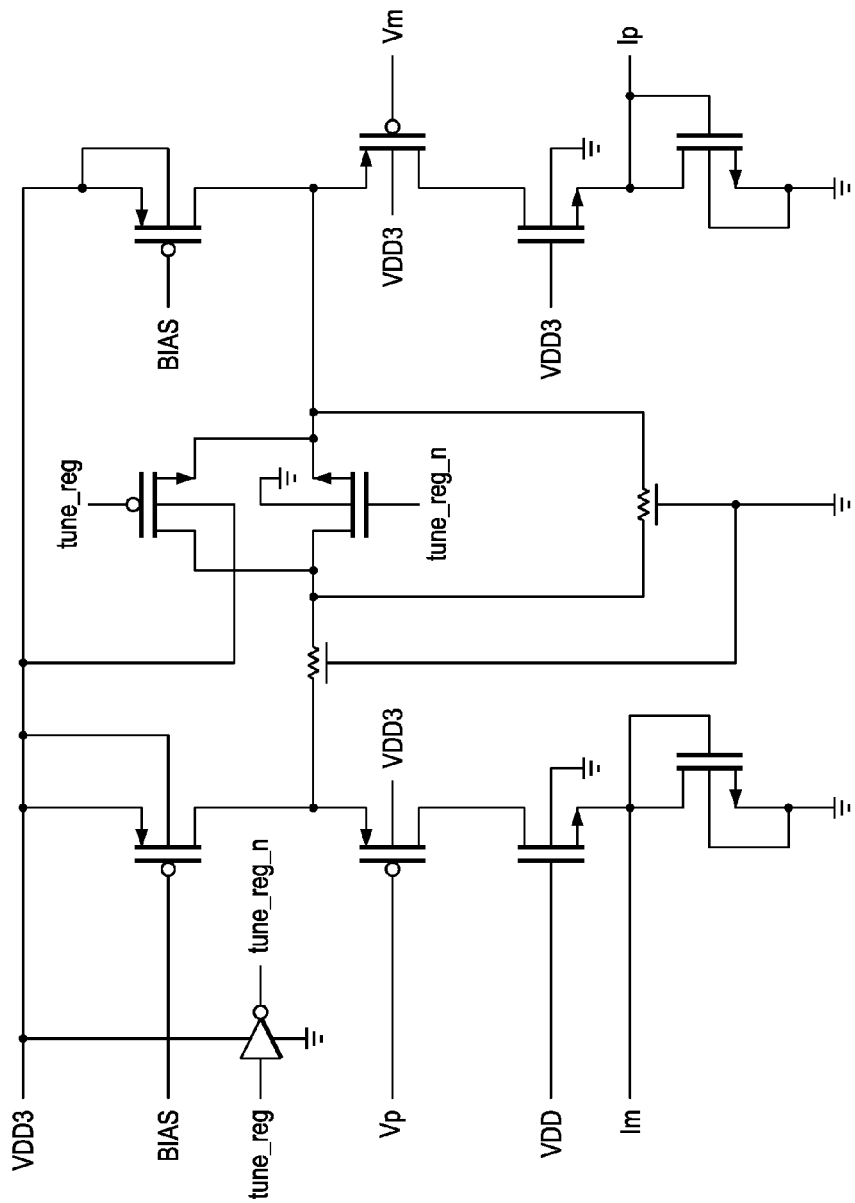
FIG. 5 illustrates an example front end, according to embodiments of the present disclosure.

FIG. 5 illustrates an example front end, according to embodiments of the present disclosure. The front end may include an implementation of the voltage to current converter shown in FIG. 2. The front end may be implemented in part with a transconductor. The transconductor may convert differential voltage into differential current and the range selection is done by adjusting its impedance value $R_s$. The transconductor may be defined according to its transconductance $g_m$, which may be given according to the differential current output divided by the differential voltage input. The overall output current of the front end may be given by:

$$I = \frac{g_{m1}}{1 + g_{m1}\frac{R_s}{2}} \Delta v_o$$

The impedance of the front end may thus be adjusted in order to adjust the output current.

Figure 6:
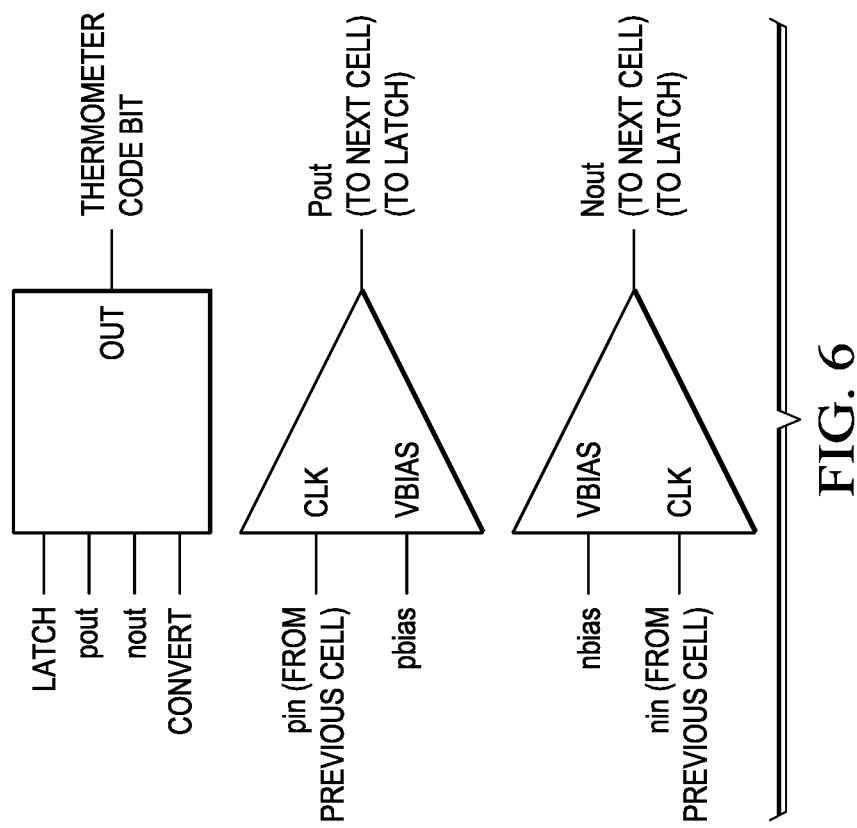
FIG. 6 illustrates example delay cells, according to embodiments of the present disclosure.

FIG. 6 illustrates example delay cells, according to embodiments of the present disclosure. Two corresponding delay cells and an associated portion of a latch are illustrated. The three may be implemented as a stack in order to create, in essence, a triple-height row or stack for a combined element. In each delay cell, output from the previous cell may be routed to a clock signal input and the pbias or nbias signal may be routed to a bias input. Once both inputs are high, the output may be routed to the next element.

Figure 7:
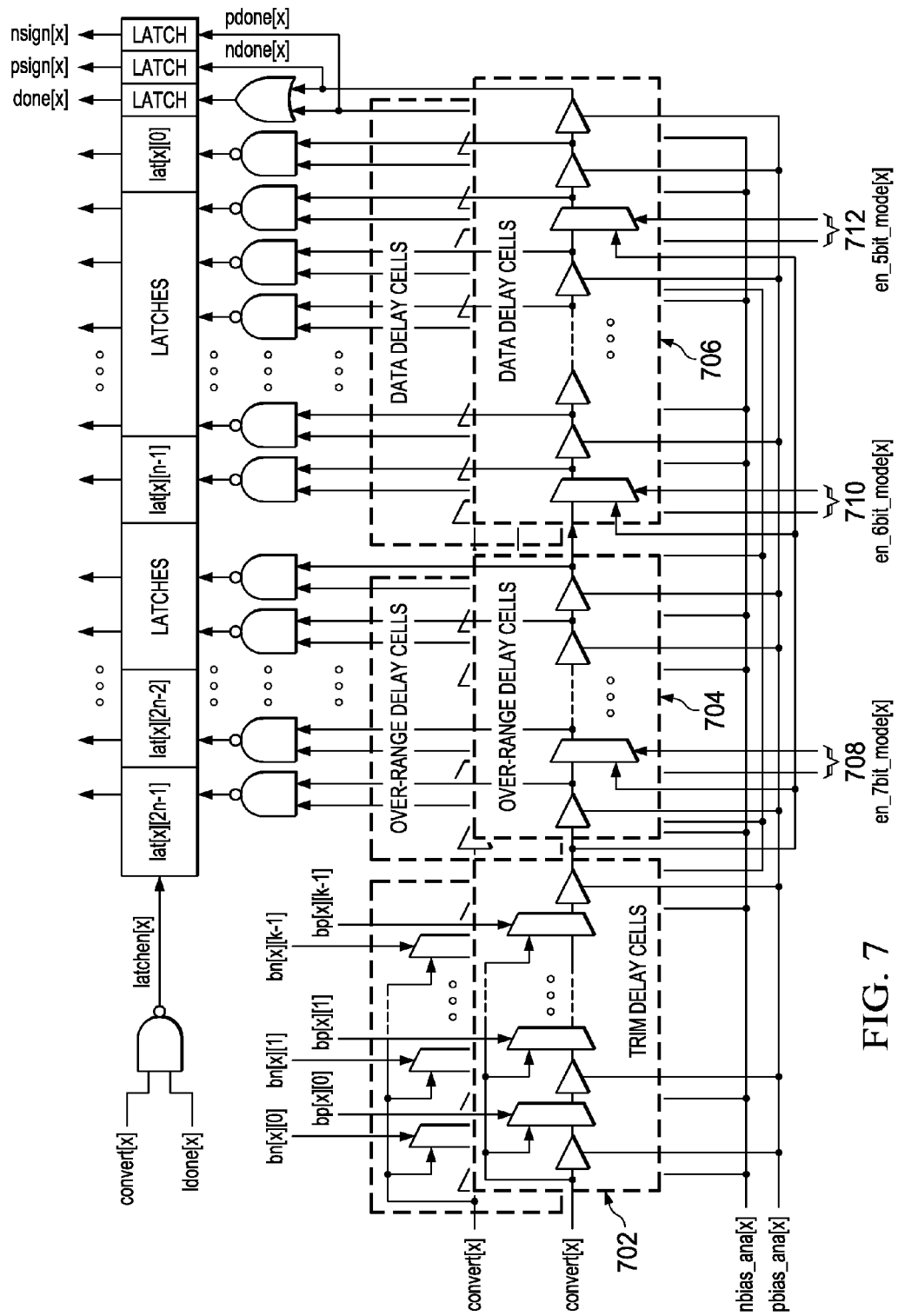
FIG. 7 is a more detailed view of ADC, according to embodiments of the present disclosure.

FIG. 7 is a more detailed view of ADC 100, according to embodiments of the present disclosure. As shown in FIG. 7, in various embodiments delay lines 116, 118 may be divided into optionally trimmed delay cells 702, over-range delay cells 704, and data delay cells 706. In some embodiments, one of trimmed delay cells 702 and over-range delay cells 704 may be omitted. Furthermore, one or more of these groups of cells may be divided into cell ranges according to desired precision of ADC 100. In one embodiment, data delay cells 706 may be divided into cell ranges according to desired precision. In another embodiment, data delay cells 706 and over-range delay cells 704 may be divided into cell ranges according to desired precision.

For example, some of the delay cells may be grouped into the number of data cells needed to support 5-bit precision for ADC 100 with a multiplexer 712. In another example, some of the delay cells may be grouped into the number of data cells needed to support 6-bit precision for ADC 100 with a multiplexer 710, or into 7-bit precision for ADC 100 with a multiplexer 708. Each such multiplexer may enable delay operation for the delay cells within the delay lines that follow the multiplexer. Thus, portions of the delay lines may be selectively activated according to a precision mode. The precision mode may be set according to a desired mode of ADC 100, user or software operation, or dynamically by ADC 100 in response to over-voltage or under-voltage situations. Enablement of 5-bit precision may enable all subsequent delay cells until the done signal generation. Similarly, enablement of 6-bit prevision may enable all subsequent delay cells until the done signal generation. The enablement of 5-bit precision delay cells may be performed. Similarly, enablement of 7-bit prevision may enable all subsequent delay cells until the done signal generation. The enablement of 5-bit and 6-bit precision delay cells may be performed.

Accordingly, there may be overlap between some of groups 704 and 706 in different cases and at different times. Cells not used for over-range might be used for regular data. Similarly, cells not used for data might be used for over-range. Moreover, the configuration of optionally trimmed delay cells 702 may be applied to elements of groups 704 or 706. While bit groupings 708, 710, 712 may be accomplished with a multiplexer applied to an entire group, within a given such bit grouping, individual multiplexers may be applied to trim portions thereof.

In group 702, individual multiplexers for delay cells may trim or omit use in propagation lines. In some cases, the multiplexer operation for delay cells in the nbias delay line might differ from corresponding delay cells in the pbias delay line. Accordingly, the length of the delay lines might be adjusted so as to compensate for offsets, such that one of the pbias or nbias lines does not go through as many delay elements as the other delay line. The multiplexers for trimming the pbias lines may be controlled through the indexed commands of bp, and multiplexers for trimming the nbias lines may be controlled through the indexed commands of bn. Trimming the delay line may calibrate the respective current values.

Figure 8:
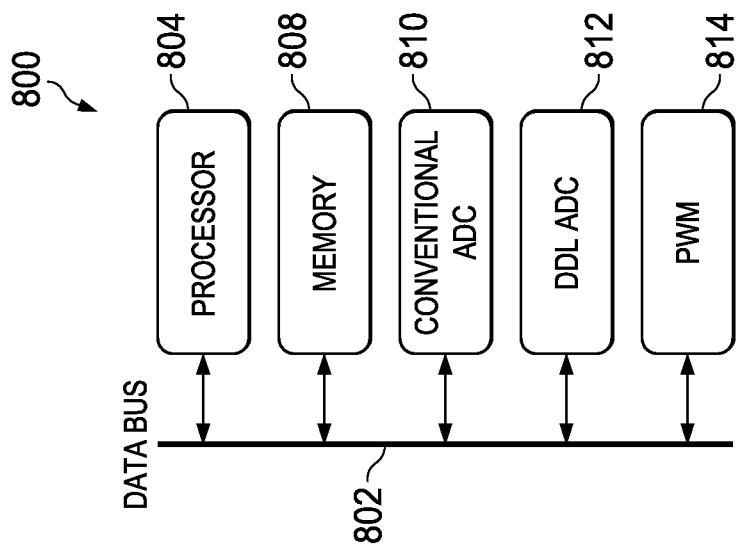
FIG. 8 is an illustration of an example system, microcontroller, or other device configured to incorporate an ADC, according to embodiments of the present disclosure.

FIG. 8 is an illustration of an example system, microcontroller 800, or other device configured to incorporate ADC 100, according to embodiments of the present disclosure. ADC 100 may be included in microcontroller 800 as a DDL ADC 812. A processor 802, memory 806, conventional ADC 810, and PWM circuit 812 may also be included. These may be communicatively coupled through a suitable data bus 802.

Operation of DDL ADC 812 may be initiated on behalf of microcontroller 800 upon execution of instructions in memory 806 by processor 802. The instructions may be for various parts of PWM 812 to perform voltage regulation. As part of the voltage regulation, voltage comparisons may be made by DDL ADC 812 or conventional ADC 810. Depending upon the results from DDL ADC 812, processor 804 may take corrective actions. For example, PWM settings might be adjusted based upon immediate conductor information.

Operation of DDL ADC 812 with respect to the rest of microcontroller 800 may be made without having to use interrupt service routines (ISRs), as would be used by conventional ADC 810. Moreover, there might be no need for direct memory access (DMA) to utilize DDL ADC 812, as would be the case when conventional ADC 810 is used. Seven instances of DDL ADC 812 might be smaller than a 15 ns comparator, and as fast as an analog comparator.

Figure 9:
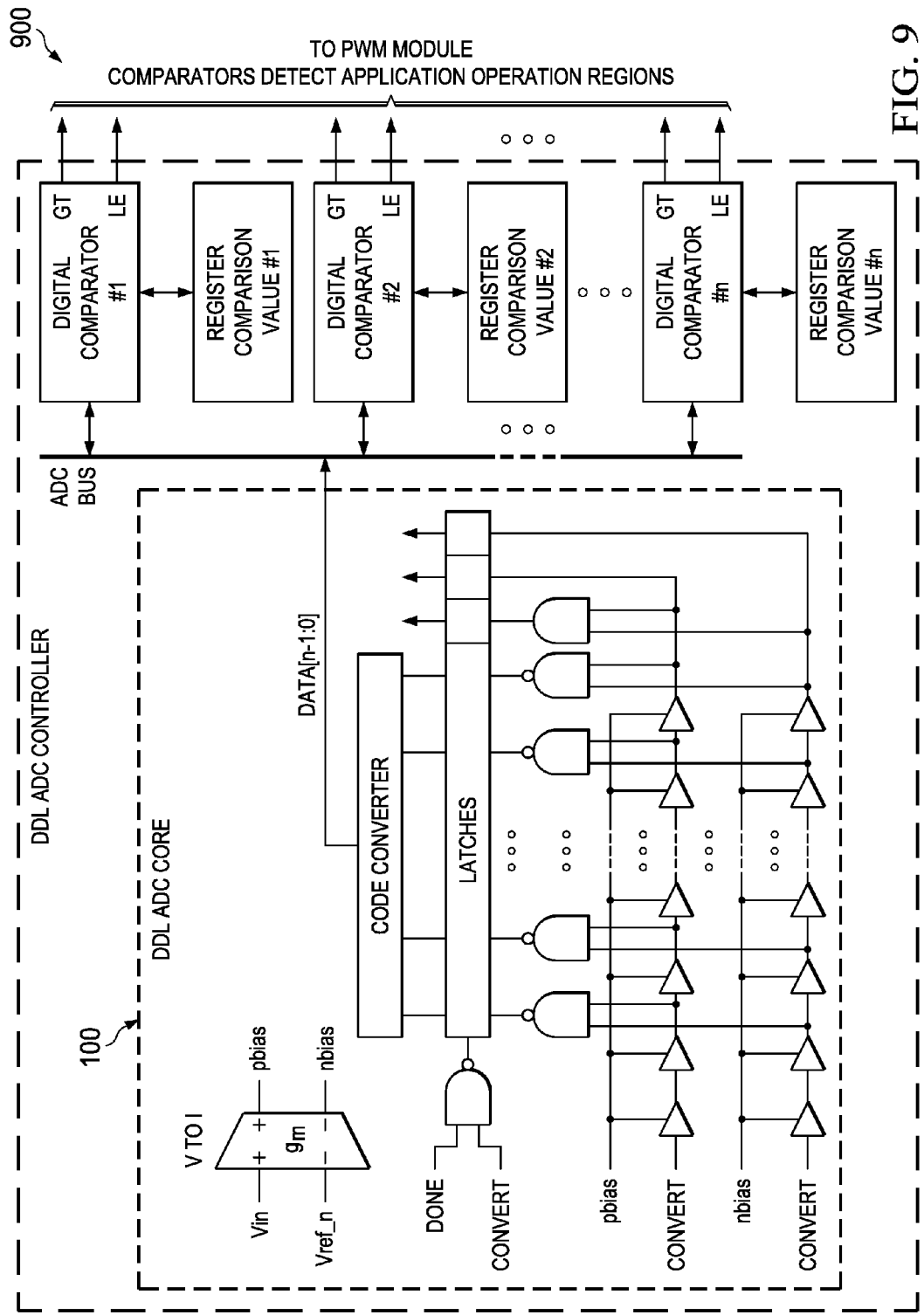
FIG. 9 is an illustration of a microcontroller with an ADC featuring digital comparators for controlling PWM, according to embodiments of the present disclosure.

FIG. 9 is an illustration of a microcontroller with a DDL ADC featuring digital comparators for controlling PWM, according to embodiments of the present disclosure.

In other applications, pure analog comparators might monitor the application to detect over or under current or over or under voltage conditions and directly turn off or on PWM signals. However, such analog comparators are limited to a single output, yet might be fast. In other applications, ADCs incorporate digital comparators to detect out of range operation and generate interrupts to a processor so software can make adjustments to the PWM. ADCs can provide multiple bits of output to software but are slow relative to a power supply control loop.

By use of ADC 100, the microcontroller might take advantage of the very high speed of the ADC 100. For example, a 5-bit implementation of ADC 100 might have a conversion time of 8.2 ns. Digital comparators and associated registers may monitor the ADC 100 data output and assert digital output signals when the data meets the comparison criteria. These output signals might be connected to a PWM circuit to provide immediate control (modification) of the PWM output signals.

Instances of ADC 100 may output their values to one or more PWM controllers or circuits. These may be routed through an ADC bus directly to one or more digital comparators. The digital comparators may be implemented in respective PWM controllers or circuits, or may be communicatively coupled thereto. The digital comparators may be programmed with register values or other indicators of which of ADC 100 signals are to be used for a given digital comparator. Thus, a digital comparator may be designated to subscribe or accept data from a given ADC 100. Furthermore, a value by which the digital comparator is to compare the ADC 100 signal may be specified in the register. A PWM controller may issue PWM signals based upon whether the differential voltage is greater than a threshold specified in the comparison value register. Moreover, different levels may be specified in the different comparison value registers. A PWM controller may issue PWM signals based upon which thresholds that the differential voltage reaches.

The digital comparators may each have two outputs, a first output indicating that the value is greater than a value stored in an associated register and a second output indicating that the value is less or equal than the value stored in the associated register. The comparators according to other embodiments may have different outputs indicating using different operators such as equal, greater, less, greater or equal, less or equal, etc. The output signals provided by the comparators can be used to control the PWM module directly. This design does not need to wait for interrupt service routines and there is no need for DMA transfers.

Figure 10:
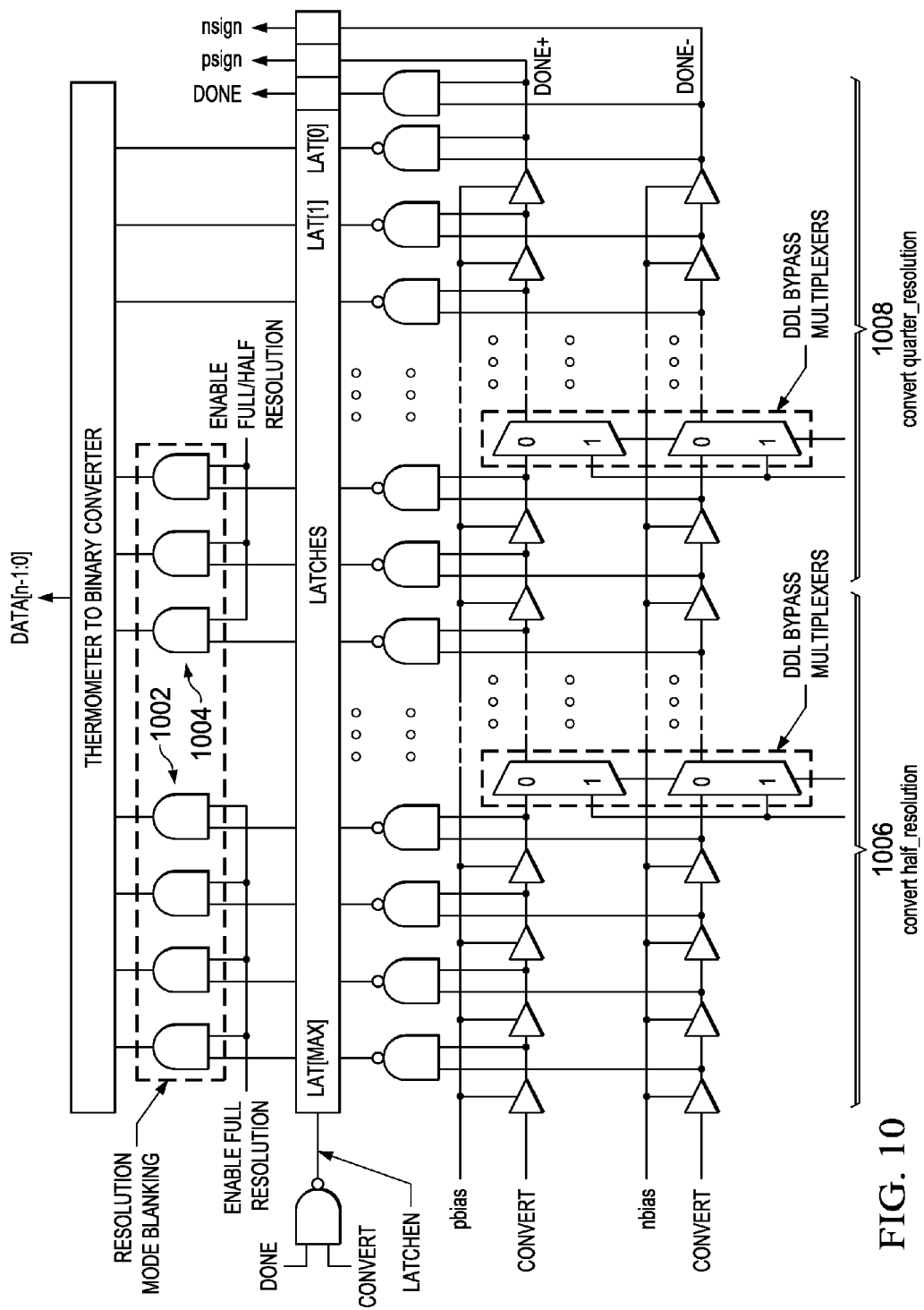
FIG. 10 is another, more detailed view of an ADC, according to embodiments of the present disclosure.

FIG. 10 is another, more detailed view of ADC 100, according to embodiments of the present disclosure. Illustrated are multiplexers 1006, 1008. Multiplexers 1006, 1008 may serve a similar purpose to multiplexers 710, 712. Multiplexer 710 may be placed at the 50% point from the DDL end. Multiplexer 712 may be placed at the 25% point from the DDL end. Other multiplexers, not shown, may be placed, for example, at the 12.5% point from the DDL end.

ADC 100 may include digital logic blocks, such as block 1002 and block 1004, to load data from the latches. The enable signals for the digital logic blocks may be tied to the multiplexer enablement. For example, when multiplexers 1006, 1008 are to enable full resolution, blocks 1002 and 1004 may allow loading of all data from the latches. When multiplexers 1006, 1008 are to enable half resolution, block 1002 may be turned off while block 1004 is turned on. Other logic blocks for quarter resolution and so forth are not shown. Such blocks also be used in coordination with the multiplexers of FIG. 7.

Each multiplexer closer to the end reduces the resolution by 1-bit but doubles the speed of conversion when shutting down part of delay lines of ADC 100. The AND gates of the logic blocks between the data latches and the thermometer to binary code converter select the applicable inputs for differing resolution selections. Such logic blocks might be implemented instead between the delay lines and the latches.

By use of the logic blocks, the "ones" in unused delay line taps are prevented from corrupting data results. Multiplexers placed in the delay lines might also provide a mechanism to insert a reset value into multiple points in the delay to yield a faster reset following a conversion cycle. This may reduce the time delay to when the next conversion can begin.

Additions, changes, modifications, or other permutations of this disclosure may be made according to the knowledge, skill, and understanding of one of skill in the art.

The invention claimed is:
1. A microcontroller comprising:
a processor core;
memory; and
a plurality of peripheral devices including a differential digital delay line analog-to-digital converter (ADC), wherein each differential digital delay line is configured to operate at a speed according to a respective differential current, the ADC comprising:
a plurality of differential digital delay lines;
a first circuit comprising a set of delay elements included in the differential digital delay lines;
a second circuit comprising another set of delay elements included in the differential digital delay lines;
wherein:
the first circuit is configured to generate data representing an analog to digital conversion of an input; and
the second circuit is configured to calibrate a source to the differential digital delay lines; and
a plurality of latches configured to store data representing or based on relative speeds of respective delay elements;
wherein a respective latch is configured to save data from a slower differential digital delay line upon a completion of faster differential digital delay line.

2. The microcontroller of claim 1, further comprising a current source circuit configured to be adjusted by a value produced by the second circuit.

3. The microcontroller of claim 1, further comprising a current source circuit configured to mirror reference currents to each of the differential digital delay lines based upon the calibration from the second circuit.

4. The microcontroller of claim 1, wherein the first circuit is configured to measure a difference between an input voltage and a reference voltage and the second circuit is configured to calibrate the source based upon the measurement between the input voltage and the reference voltage.

5. The microcontroller of claim 1, further comprising a transconductor configured to convert an input differential voltage to a differential current, wherein the first circuit is configured to measure the differential current and generate data representing the differential voltage.

6. The microcontroller of claim 1, further comprising a transconductor configured to:
convert an input differential voltage to a differential current; and
accept an input based on the plurality of differential digital delay lines to adjust a voltage-to-current range.

7. The microcontroller of claim 1, wherein each differential digital delay line includes a chain of current limited buffers.

8. The microcontroller of claim 1, further comprising a third circuit comprising yet another set of delay elements included in the differential digital delay line, wherein the third circuit is configured to produce data to indicate a degree to which an input to the ADC is out of an input range.

9. A microcontroller comprising:
a processor core;
memory; and
a plurality of peripheral devices including a differential digital delay line analog-to-digital converter (ADC), wherein each differential digital delay line is configured to operate at a speed according to a respective differential current, the ADC comprising:
a plurality of differential digital delay lines;
a first circuit comprising a set of delay elements included in the differential digital delay lines; and
a second circuit comprising another set of delay elements included in the differential digital delay lines;
wherein:
the first circuit is configured to generate data representing an analog to digital conversion of an input; and
the second circuit is configured to produce data to indicate a degree to which an input to the ADC is out of an input range; and
a latch configured to save data from a slower differential digital delay line upon a completion of faster differential digital delay line.

10. The microcontroller of claim 9, wherein the first circuit is configured to measure a difference between an input voltage and a reference voltage.

11. The microcontroller of claim 9, further comprising a pulse-width-modulation (PWM) circuit, wherein the processor core is configured to adjust operation of the PWM circuit based upon the degree to which the input to the ADC is out of the input range.

12. The microcontroller of claim 9, wherein the processor core is further configured to adjust the input range based upon the degree to which the input to the ADC is out of the input range.

13. The microcontroller of claim 9, further comprising a transconductor configured to convert an input differential voltage to a differential current, wherein the first circuit is configured to measure the differential current and generate data representing the differential voltage.

14. The microcontroller of claim 9, further comprising a transconductor configured to:
convert an input differential voltage to a differential current; and
accept an input based on the plurality of differential digital delay lines to adjust a voltage-to-current range.

15. The microcontroller of claim 9, wherein each differential digital delay line includes a chain of current limited buffers.

16. The microcontroller of claim 9, wherein:
a given differential digital delay line is configured to operate at a speed according to a differential current applied to the given differential digital delay line;
the ADC further comprises a latch; and
the latch is configured to save data from a slower differential digital delay line upon a completion of faster differential digital delay line.

17. The microcontroller of claim 9, further comprising a third circuit comprising a yet another set of delay elements included in the differential digital delay line, wherein the third circuit is configured to calibrate a source to the differential digital delay lines.

18. A microcontroller comprising:
a processor core;
memory; and
a plurality of peripheral devices including a differential digital delay line analog-to-digital converter (ADC), the ADC comprising:
a plurality of differential digital delay lines;
a first circuit comprising a set of delay elements included in the differential digital delay lines; and
a transconductor configured to:
convert an input differential voltage to a differential current; and
accept an input based on the plurality of differential digital delay lines to adjust a voltage-to-current range; and
a plurality of latches configured to store data representing or based on relative speeds of respective delay elements;
wherein a respective latch is configured to save data from a slower differential digital delay line upon a completion of faster differential digital delay line.

19. The microcontroller of claim 1, wherein the further comprising a second circuit comprising a yet another set of delay elements included in the differential digital delay line, wherein the second circuit is configured to produce data to indicate a degree to which an input to the ADC is out of an input range.

20. The microcontroller of claim 1, wherein the latches are configured to store thermometer codes.

* * * * *